United States Patent [19]
Wu

[11] Patent Number: 5,948,169
[45] Date of Patent: Sep. 7, 1999

[54] APPARATUS FOR PREVENTING PARTICLE DEPOSITION IN A CAPACITANCE DIAPHRAGM GAUGE

[75] Inventor: Wen-Kai Wu, Kaohsiung, Taiwan

[73] Assignee: Vanguard International Semiconductor Corporation, Hsinchu, Taiwan

[21] Appl. No.: 09/038,758

[22] Filed: Mar. 11, 1998

[51] Int. Cl.[6] .................................................. C23C 16/00
[52] U.S. Cl. ............................ 118/723 FI; 118/723 FE; 118/715; 73/715; 73/718; 73/724
[58] Field of Search ................................... 118/715, 723; 73/715, 718, 724

[56] References Cited

U.S. PATENT DOCUMENTS 5,433,780  7/1995  Ikeda et al. ............................... 118/50
5,728,222  3/1998  Barbee et al. ............................ 118/715

Primary Examiner—Bruce Breneman
Assistant Examiner—Erin Fieler
Attorney, Agent, or Firm—Christensen O'Connor Johnson & Kindness PLLC

[57] ABSTRACT

Apparatus for reducing a material deposition in a housing is disclosed herein. The apparatus includes: a first pressure sensing device which senses a pressure in a reaction chamber, a pumping device for pumping the vapor from the reaction chamber to the pumping device, a valve that is opened when the pressure is larger than a first value and smaller than a second value, a bypass valve which is closed when the pressure is larger than the third value and smaller than the fourth value, a check valve that blocks a gas flow from the check valve to the bypass valve, and a pipe for connecting all of the above.

9 Claims, 6 Drawing Sheets

APPARATUS FOR PREVENTING PARTICLE DEPOSITION IN A CAPACITANCE DIAPHRAGM GAUGE

TECHNICAL FIELD OF THE INVENTION

The present invention relates to the unwanted deposition in a capacitance diaphragm gauge (CDG), and more particularly, to a method for reducing the deposition of $NH_4Cl$ in the CDG.

BACKGROUND OF THE INVENTION

Forming a silicon nitride ($Si_3N_4$) layer is one of the most significant processes in the semiconductor industry. This is because a $Si_3N_4$ layer is often used as a mask in etching $SiO_2$. In depositing the $Si_3N_4$ layer, the primary byproduct produced is $NH_4Cl$. The reaction generating $Si_3N_4$ is shown below:

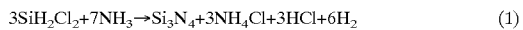

$$3SiH_2Cl_2+7NH_3 \rightarrow Si_3N_4+3NH_4Cl+3HCl+6H_2 \qquad (1)$$

The aforementioned reaction is usually performed in a reaction chamber. A device referred to as a CDG (capacitance diaphragm gauge) is usually used to monitor the pressure of the reaction process in the chamber. The construction of a prior art chamber and CDG is shown in FIG. 1. There are two pressure sensing devices in this system: a first pressure sensing device 24 and a second pressure sensing device 20. The purpose of the pressure sensing devices are to show the pressure in the chamber so that the operator can monitor the process. The second pressure sensing device 20 operates within the range of 0–1000 Torr pressure, and the first pressure sensing device 24 operates within the range of 0–10 Torr pressure. When the pressure in the sensing device is within the range of operation, the associated valve is opened. However, the valve is closed when the pressure in the pressure sensing device is beyond the range of operation.

Further, a pipe 12 has 3 branches, 12a, 12b, and 12c. Pipe 12a connects the chamber 10 and a main valve 14. Pipe 12b connects the first valve 26 and the second valve 22 to the pipe 12a. The pipe 12c connects the main valve 14 and the pump 18. When the main valve 14 is opened, the pressure in the pipe 12a, 12b and 12c are the same. When the main valve 14 is closed, the pressure in pipe 12a and 12b is typically 760 Torr. The pump 18 nominally operates to reduce the pressure to 0.005 Torr. Therefore, the pressure in the pipe 12c is also 0.005 Torr.

FIG. 3A shows in detail the pressure sensor 24. The pressure in the space between first valve 26 and the diaphragm 30 is typically set to be 10 Torr. The pressure in the chamber 10 is always the same as that in the pipe 12a and 12b.

Turning next to FIG. 2, curve 28 shows the pressure of the chamber and the CDG in an exemplary run. There are many processes included in a run. Referring to the horizontal axis of FIG. 2, from point a to point b, the chamber and the CDG are in "standby" mode. From point b to point c, the pressure of the chamber and the CDG is decreased until the pressure of the chamber and the CDG equals to 0.005 Torr. From point c to point d, the pressure of the chamber and the CDG are maintained at 0.005 Torr and a leakage check is processed. At this time, as shown in FIG. 3A, the valve 26 is opened and there is no $NH_4Cl$ present in the first pressure sensing device 24.

From point e to f, the process in the chamber is performed, e.g., the deposition of the silicon nitride ($Si_3N_4$) is done. The pressure of the aforementioned process is about at 0.12–0.3 Torr, so the pressure of the chamber and the CDG is maintained at about 0.12–0.3 Torr until the next process. At this time, as shown in FIG. 3B, the valve 26 is opened and the vapor phase $NH_4Cl$ 31a is injected to the first pressure sensing device 24. The next step is to increase the pressure of the chamber and the CDG until the pressure equals to 760 Torr.

For the point after g, the chamber and the CDG are in the "standby" state again, and a run of the chamber and the CDG is thus finished. When the pressure exceeds 10 Torr, referring to FIG. 3C, the valve 26 is closed and the pressure in the first pressure sensing device 24 is maintained at 10 Torr. Thus, the $NH_4Cl$ in vapor phase changes to the solid phase and deposits on the surface of the space between valve 26 and diaphragm 30 of the first pressure sensing device 24 including the surface of the diaphragm 30.

The aforementioned solid $NH_4Cl$ not only affects the sensitivity of the diaphragm, but also may be a source of particle contamination in the next run in the chamber. For example, in a subsequent run, the solidified $NH_4Cl$ 31b will be evaporated when the pressure is less then 10 Torr. As illustrated in FIG. 3D, when the leakage check or the reaction is processed under a pressure less than 10 Torr, the valve 26 is opened and the vapor phase $NH_4Cl$ 31a passes through the valve 26 to the chamber 10. A contamination particle source is thus formed in the first pressure sensing device 24. The more times the CDG is used, the more amount of solid phase $NH_4Cl$ is deposited in the first pressure sensing device 24.

According to the phase diagram shown in FIG. 4, unless the temperature of the first pressure sensing device 24 is always kept above 200° C., the $NH_4Cl$ in vapor phase will be deposited in the first pressure sensing device 24 when the pressure is about 10 Torr.

Furthermore, when the solid phase $NH_4Cl$ is not thoroughly purged, the $NH_4Cl$ in vapor phase will deposit on the surface of the first pressure sensing device 24 at 150° C., even though the pressure is about 10 Torr. Unfortunately, it is hard to remove the solid $NH_4Cl$ in the first pressure sensing device 24 because of the shape of the first pressure sensing device 24. If the first pressure sensing device 24 is not heated, the vapor phase $NH_4Cl$ will be deposited in the first pressure sensing device 24, and the lifetime of CDG is about 1.5–2 months. If the first pressure sensing device 24 is heated to 150° C. as used in the prior art, the vapor phase $NH_4Cl$ will be deposited in the first pressure sensing device 24 also. The lifetime of the heated CDG mentioned above is about 1–1.5 years.

Because the vapor phase $NH_4Cl$ is deposited on the surface of the diaphragm of the gauge in the prior art, the sensitivity of the gauge is degraded. The effect of the deposited residue is negligible when the gauge is used in a process of low pressure chemical vapor deposition fabricating a $Si_3N_4$ layer of 1500–2000 angstroms in thickness. However, the effect of the $NH_4Cl$ on the diaphragm is significant when the process is used to form a thin layer, such as a ONO layer of 50 angstroms in thickness.

SUMMARY OF THE INVENTION

An apparatus for reducing deposition of residue in a first housing, said residue being formed from a vapor in said first housing, said vapor generated by a semiconductor process reaction chamber during a process, is disclosed. The apparatus comprises: first pressure sensing means for sensing a pressure in said reaction chamber responding to a first capacitance in said first pressure sensing means, said first pressure sensing means comprising said first housing, said first housing comprising a first diaphragm, said first capacitance being formed by using said first diaphragm and a first platform as a first plurality of electrodes of a first capacitor, said first capacitance being changed owing to a first deflection of said first diaphragm under forces due to said pressure; pumping means for pumping said vapor from said reaction chamber; monitoring gas flow control means, said monitoring gas flow control means being opened when said pressure is larger than a first value and smaller than a second value, said first value being smaller than said second value, a first end of said monitoring gas flow control means being connected to said reaction chamber, a second end of said monitoring gas flow control means being connected to said first housing of said first pressure sensing means; bypass gas flow control means, said bypass gas flow control means being closed when said pressure is larger than a third value and smaller than a fourth value, said third value being smaller than said fourth value, said fourth value being larger than said second value; a filter connected to said bypass gas flow control means for preventing said residue from passing through said filter; a flow direction control means for blocking a gas flow from said flow direction control means to said bypass gas flow control means; and a pipe for connecting said first housing of said first pressure sensing means, said bypass gas flow control means, said filter, said flow direction control means and said pumping means.

BRIEF DESCRIPTION OF THE DRAWINGS

The above features of the present invention will be more clearly understood from consideration of the following descriptions in connection with accompanying drawings in which.

DETAILED DESCRIPTION OF THE PREFERRED EMBODIMENT

Figure 1:
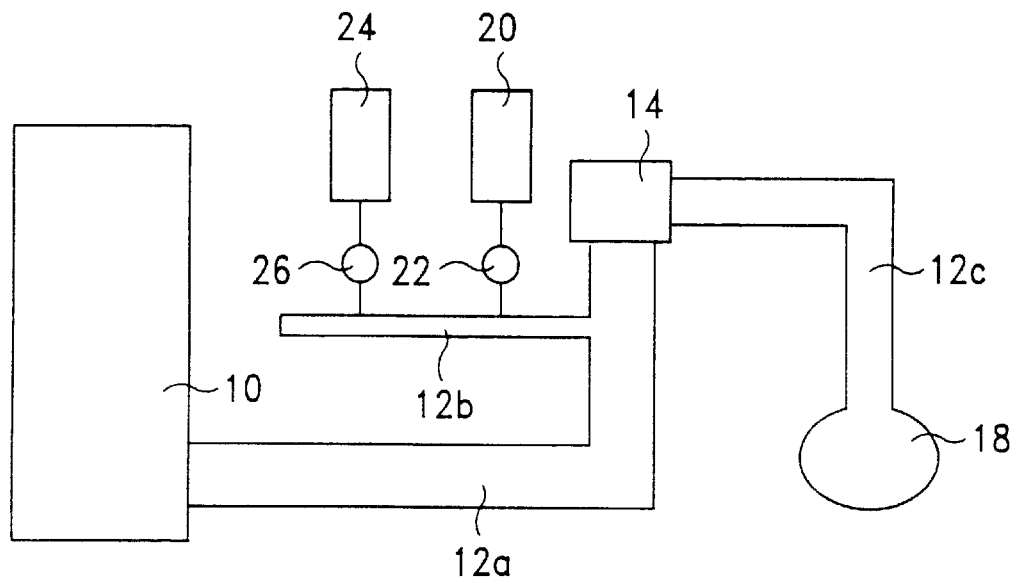
FIG. 1 shows in schematic format a prior art reaction chamber with a prior art pressure sensing system.
Figure 5:
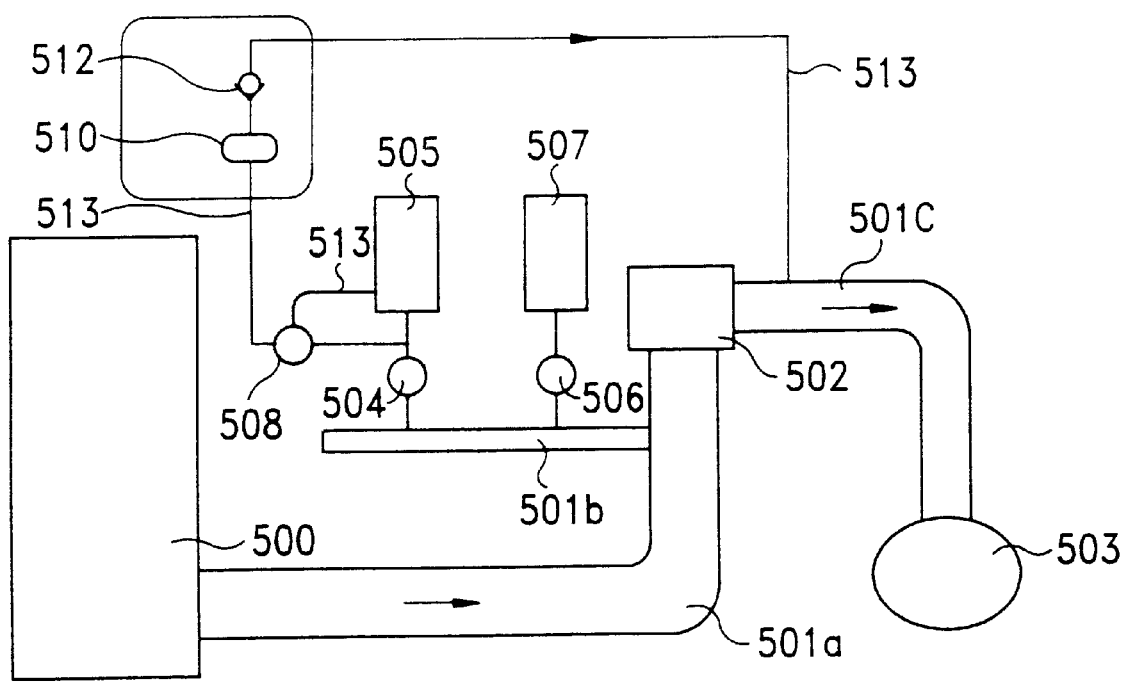
FIG. 5 is a schematic diagram of a reaction chamber and pressure sensing system using a CDG formed in accordance with the present invention.

The present invention is an apparatus for preventing byproducts from a reaction in a reaction chamber from depositing in a CDG pressure sensor. Referring to FIG. 5, the reaction forming $Si_3N_4$ is performed in a reaction chamber 500. The gas flow is pumped through a pipe 501 and a main valve 502 by a pump 503. Like the prior art system of FIG. 1, pipe 501 consists of three sub sections, pipe section 501a between the main valve 502 and the reaction chamber 500, pipe section 501b between the main valve 502 and a sensor section, and pipe section 501c between main valve 502 and pump 503. A first valve 504 connects a first pressure sensing device 505 with pipe section 501b. Similarly, a second valve 506 connects a second pressure sensing device 507 with pipe section 501b.

A bypass valve 508 is connected to the first pressure sensing device 505. Further, a filter 510 is connected to the bypass valve 508. The gas flow from the first pressure sensing device 505 goes through the bypass valve 508 and the filter 510. Thus, the particles in the gas flow is filtered by the filter 510.

The filter 510 is preferably capable of 3 nanometer filtration of semiconductor process gases. The filter 510 is connected to a check valve 512, and the check valve 512 is connected to pipe section 501c. The check valve 512 is used to control the direction of the gas flow. In this embodiment, the check valve 512 is designed to let the gas flow from filter 510 to the check valve 512. The first pressure sensing device 505, the second pressure sensing device 507, the first valve 504, the bypass valve 508, the filter 510, the check valve 512 and the pipe section 501c are all connected by a pipe 513 as illustrated in FIG. 5.

Figure 6:
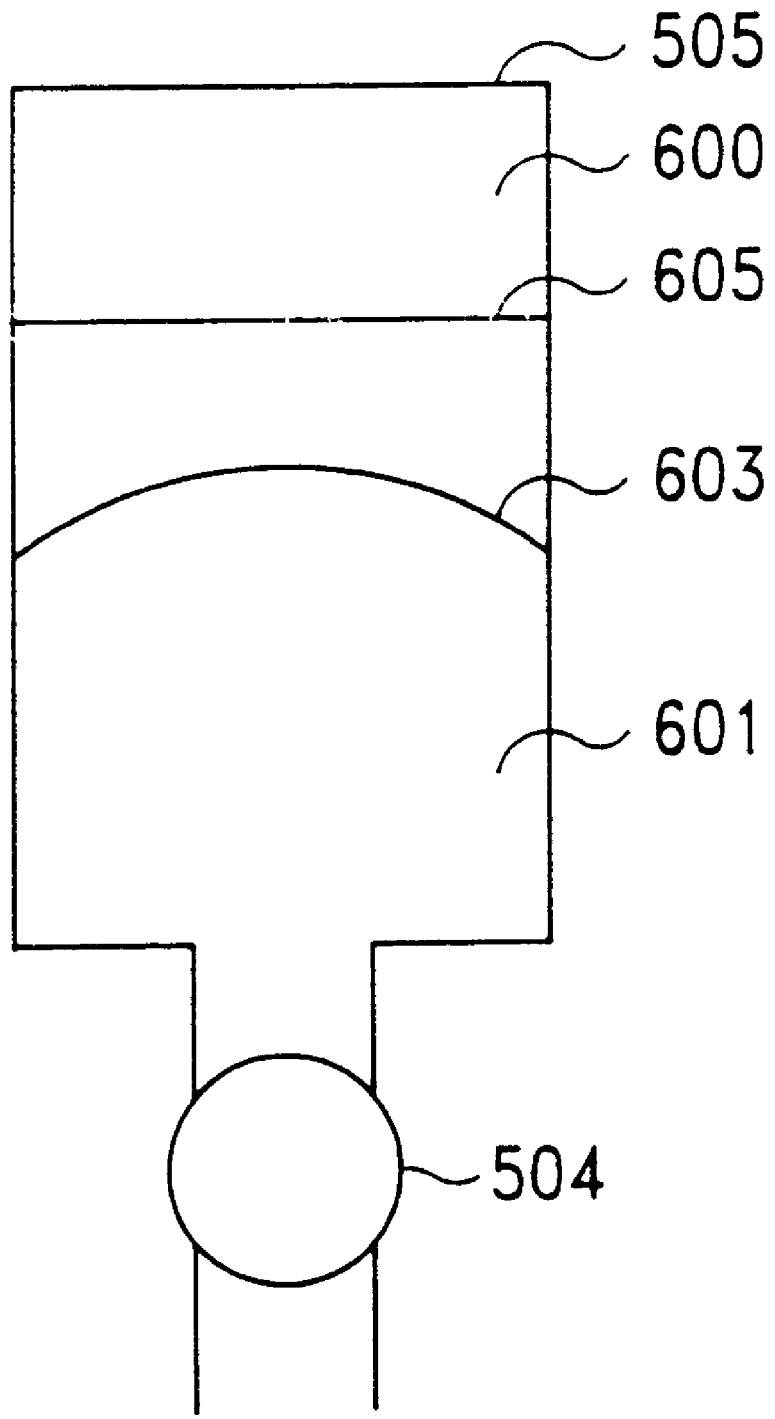
FIG. 6 shows the electrodes that forms the capacitor in the capacitance diaphragm gauge (CDG)

The configuration of the pressure sensing device 505 is shown in FIG. 6. The pressure sensing device 505 includes a diaphragm 603 and a metal platform 605. A background space 600 is formed between the metal platform 605 and the end of the sensing device 505. The pressure in the background space 600 is nominally on the order $10^{-9}$ Torr. A front space 601 is formed between the diaphragm 603 and the valve 504. The pressure in the front space 601 is nominally on the order $10^{-3}$ Torr. The maximum difference between the background space 600 and the front space 601 is confined to the order $10^6$ because of the material used in forming the diaphragm 603. The diaphragm 603 and the metal platform 605 acts as a capacitor when there are charges on the diaphragm 603 and the metal platform 605.

As can be appreciated, the capacitance of a capacitor is proportional to the area of the electrodes of the capacitor and inversely proportional to the distance between the electrodes of the capacitor. When the valve 504 is opened, the gas flows into the pressure sensing device. If there is any change in pressure in the gas flow, the deflection of the diaphragm 603 will make the capacitance between the diaphragm and the metal platform change. By measuring the capacitance between the diaphragm and the platform, the pressure on the diaphragm may be determined.

Figure 7A:
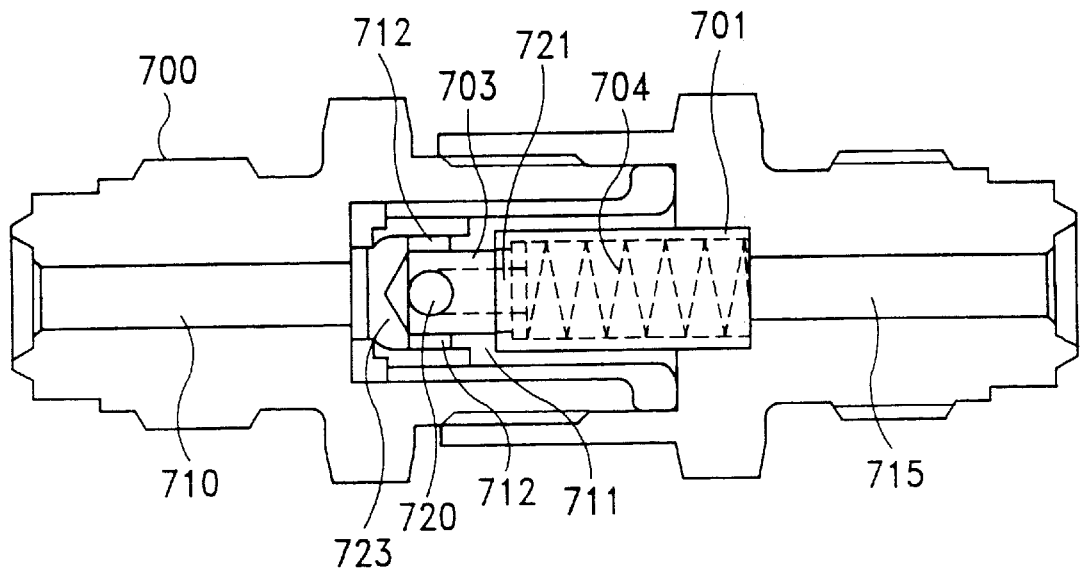
FIG. 7A shows the configuration of a check valve of the present invention in the open position.
Figure 7B:
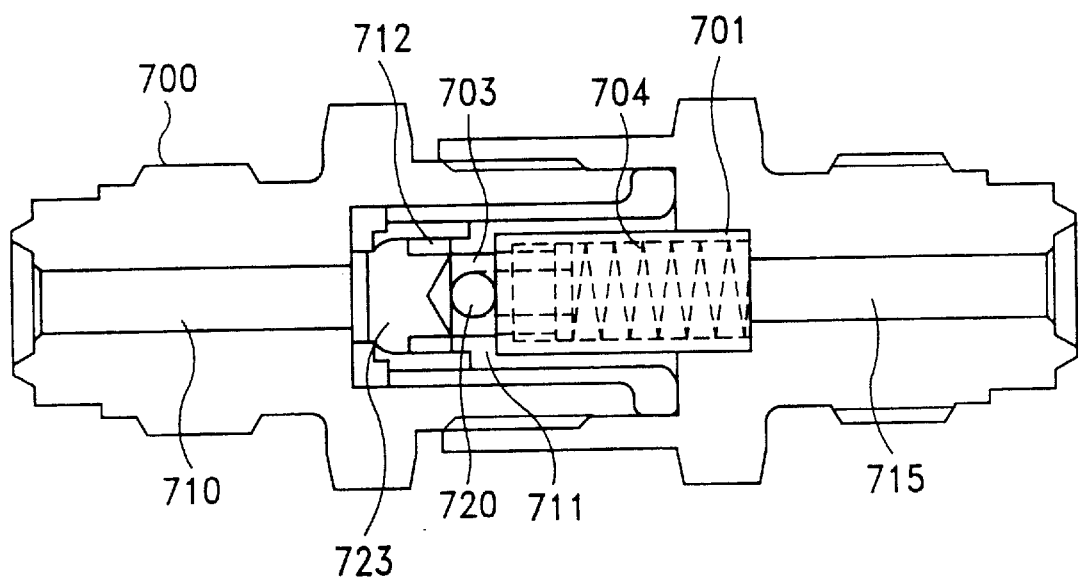
FIG. 7B shows the configuration of a check valve of the present invention in the closed position.

A cross sectional view of the check valve 512 is shown in FIG. 7A and FIG. 7B. The check valve 512 includes a body 700, a seat packing 701, a head 703 and a spring 704. When the pressure of a first inlet 710 is larger than that of the space 711, the head 703 and the ring 712 are pushed by the difference in pressure. The pressure in space 711 is the same as that of a second inlet 715 because the hole 720 and a third inlet 721 are connected to the second inlet 715. Furthermore, the space 711 is separated from the first inlet 710 by the head 703 and the ring 712. The diameter of the head 703 and the ring 712 is the same as that of a coupling tunnel 723. The coupling tunnel 723 is connected to the first inlet 710. The head 703 combined with the ring 712 move back and forth in the coupling tunnel 723. The movement of the head 703 and the ring 712 is determined by the difference of pressures between the first tunnel 710 and the space 711.

As shown in FIG. 7B, the head 703 is pushed to suppress the spring, and the ring 712 arrives at the seat packing 701, thus preventing the head 703 from continuously shrinking. At this moment, the coupling tunnel 723 and the space 711 are connected, and the hole 720 are connected to the space 711. So the first inlet 710 and the second inlet 715 are connected via the coupling tunnel 723, the hole 720, and the third inlet 723. For the reason mentioned above, the check valve 512 can restrict the direction of the gas flowing through the check valve 512.

Figure 2:
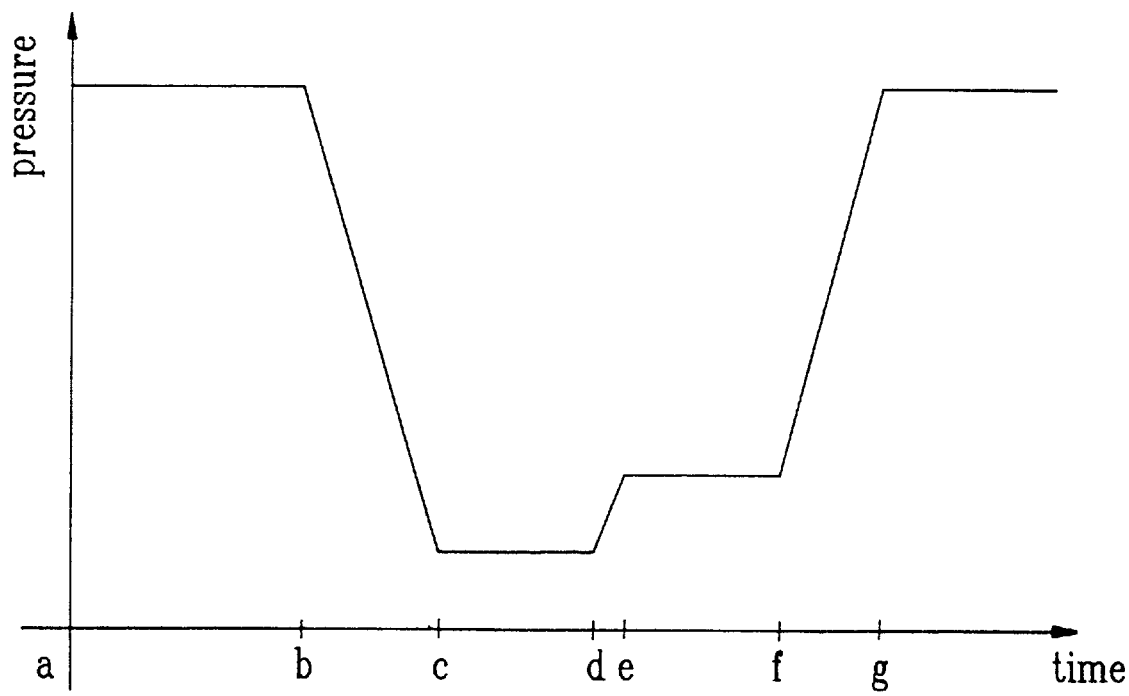
FIG. 2 shows the pressure in the reaction chamber of FIG. 1 during one cycle of a typical process.

Returning to FIG. 2, from point a to point b, the reaction chamber and the CDG are in "standby" mode. From point b to point c, the pressure of the reaction chamber and the CDG are decreased until the pressure of the chamber and the CDG equals to 0.005 Torr. While the pressure is continuously decreased, the bypass valve 508 (FIG. 5) is closed at the pressure of 20 Torr, and then the first valve 504 is opened at the pressure of 10 Torr.

From point c to point d, the pressure of the chamber and the CDG are maintained at 0.005 Torr and the leakage check is processed. At this time, the second valve 506 is opened and there is no $NH_4Cl$ in the first pressure sensing device 505. From point e to f, the reaction in the chamber is processed, e.g., the deposition of the silicon nitride ($Si_3N_4$).

Figure 3D:
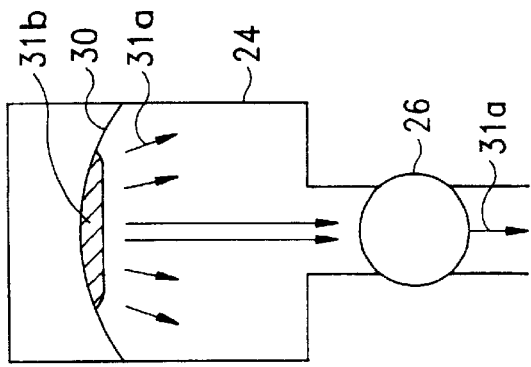
FIGS. 3A–3D shows the position of the valve and the diaphragm of the pressure sensing device of FIG. 1 during a process.
Figure 3C:
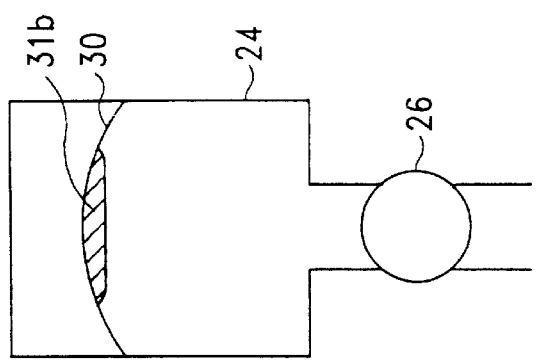
Figure 3B:
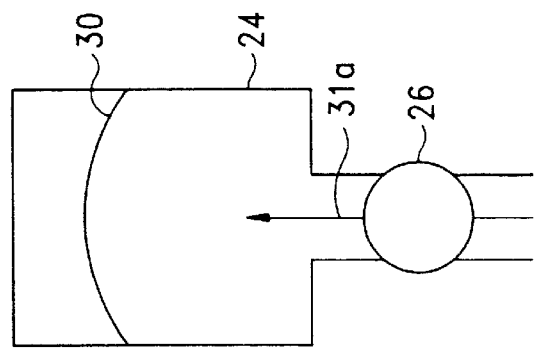
Figure 3A:
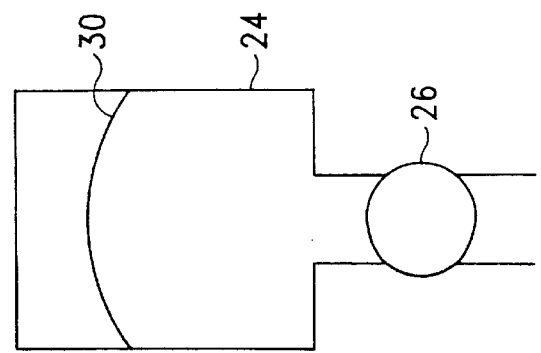

The pressure of the aforementioned process is about 0.12–0.3 Torr, so the pressure of the chamber and the CDG is maintained at about 0.12–0.3 Torr until the next process. At this time, as shown in FIG. 3B, the valve 26 is opened and the vapor phase $NH_4Cl$ 31a is injected to the first pressure sensing device 505. The next step is to increase the pressure of the chamber and the CDG until the pressure equals to 760 Torr. When the pressure is continuously increased, the first valve 504 is closed at the pressure of 10 Torr, and the bypass valve 508 is opened at the pressure of 20 Torr.

Figure 4:
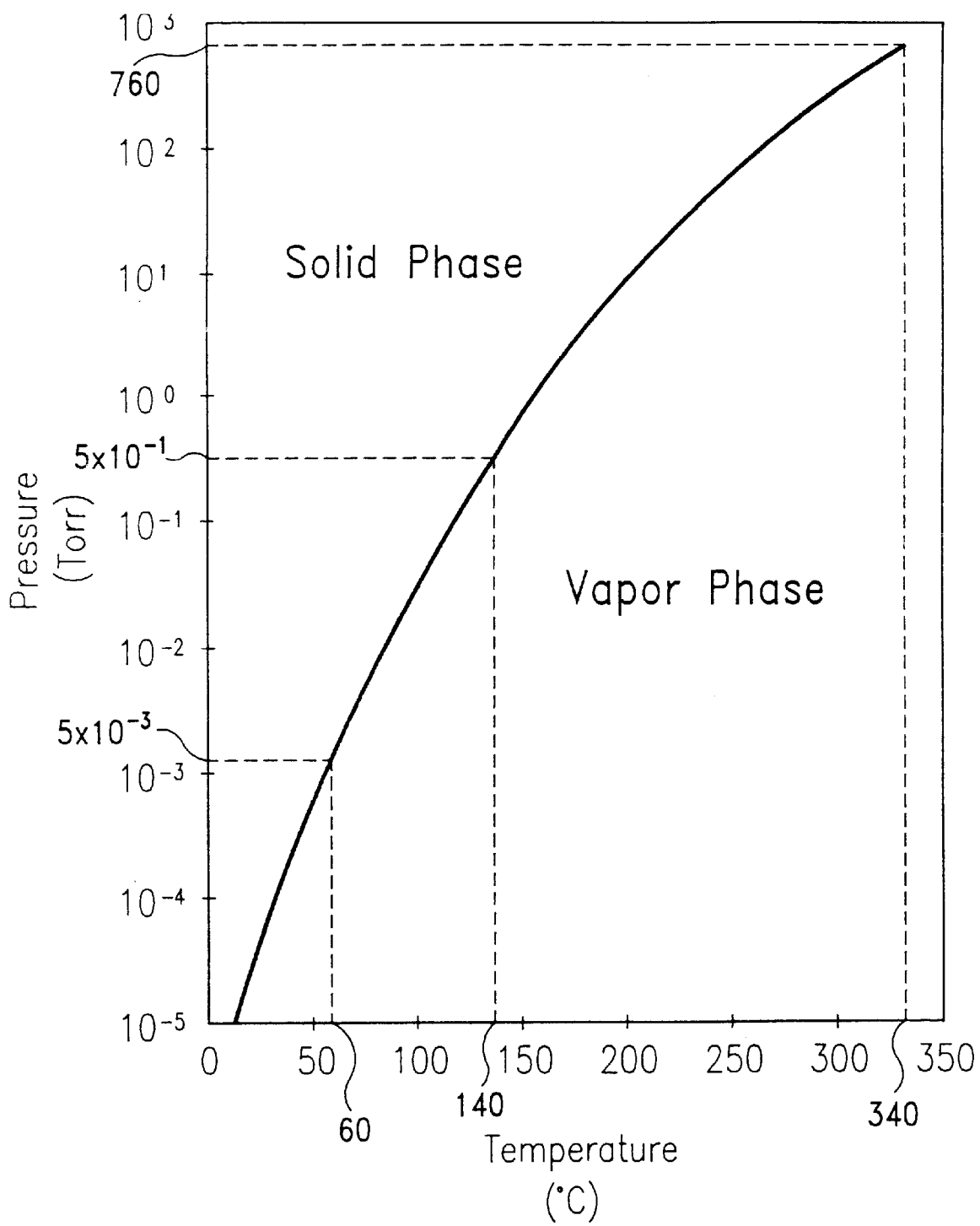
FIG. 4 is the phase transfer curve of $NH_4Cl$.

For the point after g, the chamber and the CDG are in the "standby" state again and the process run is complete. Because the filter 510 (FIG. 5) is connected to the check valve 512, and the check valve is connected to the pipe 501 behind the main valve 502, when the bypass valve 508 is opened and the first valve 504 is closed, the pump 503 continuously pumps the gas through pipe 513. Thus, the pressure in the first pressure sensing device 505 is maintained at 0.005 Torr. Referring to FIG. 4, it is clear that the vapor phase NH4Cl has no opportunity to transfer to the solid phase $NH_4Cl$ in the CDG.

When the main valve 502 is opened, the pressure in the pipe 501a, 501b and 501c are all the same. When the main valve 502 is closed, the pressure in the pipe 501a and 501b is 760 Torr, whereas the basic pressure of the pump is 0.005 Torr, so the pressure in the pipe 501c and the pipe 513 is 0.005 Torr. Because the first pressure sensing device 505, the first valve 504, the bypass valve 508, the filter 510, the check valve 512 and the pipe 501c are connected by a pipe 513, the pressure in the first pressure sensing device 505 is also 0.005 Torr.

For the reason mentioned above, the present invention offers a CDG that is resistant to the deposition of $NH_4Cl$ particles on the diaphragm. Therefore, the life time of the CDG is lengthened, and it is easy for the operator to control the thickness of the $Si_3N_4$ according to the value of the pressure as indicated. Moreover, a contamination particle source is eliminated in such a configuration of CDG according to the present invention.

Although specific embodiments have been illustrated and described it will be obvious to those skilled in the art that various modification may be made without departing from the spirit which is intended to be limited solely by the appended claims.

What is claimed is:

1. An apparatus for reducing deposition of residue in a first housing, said residue being formed from a vapor in said first housing, said vapor generated by a semiconductor process reaction chamber during a process, said apparatus comprising:

first pressure sensing means for sensing a pressure in said reaction chamber responding to a first capacitance in said first pressure sensing means, said first pressure sensing means comprising said first housing, said first housing comprising a first diaphragm, said first capacitance being formed by using said first diaphragm and a first platform as a first plurality of electrodes of a first capacitor, said first capacitance being changed owing to a first deflection of said first diaphragm under forces due to said pressure;

pumping means for pumping said vapor from said reaction chamber;

monitoring gas flow control means, said monitoring gas flow control means being opened when said pressure is larger than a first value and smaller than a second value, said first value being smaller than said second value, a first end of said monitoring gas flow control means being connected to said reaction chamber, a second end of said monitoring gas flow control means being connected to said first housing of said first pressure sensing means;

bypass gas flow control means, said bypass gas flow control means being closed when said pressure is larger than a third value and smaller than a fourth value, said third value being smaller than said fourth value, said fourth value being larger than said second value;

a filter connected to said bypass gas flow control means for preventing said residue from passing through said filter;

a flow direction control means for blocking a gas flow from said flow direction control means to said bypass gas flow control means; and a pipe for connecting said first housing of said first pressure sensing means, said bypass gas flow control means, said filter, said flow direction control means and said pumping means.

2. The apparatus as claim 1, wherein said monitoring gas flow control means is a valve.

3. The apparatus as claim 1, wherein said bypass gas flow control means is a valve.

4. The apparatus as claim 1, wherein said flow direction control means comprises a check valve, said check valve being a unidirectional valve.

5. The apparatus as claim 1, wherein said apparatus further comprises:

a second pressure sensing means for sensing said pressure in said pipe and responding to a second capacitance in said first pressure sensing means, said second pressure sensing means comprising a second housing, said second housing comprising a second diaphragm, said second capacitance being formed by using said second diaphragm and a second platform as a second plurality of electrodes of a second capacitor, said second capacitance being changed due to a second deflection of said second diaphragm under forces due to said pressure, said second housing being connected to said monitoring gas flow control means and said bypass gas flow control means; and reference gas flow control means, said reference gas flow control means being opened when said pressure being larger than a fifth value and smaller than a sixth value, said fifth value being smaller than said sixth value, a first end of said reference gas flow control means being connected to said gas containing means, a second end of said reference gas flow control means being connected to said second housing of said second pressure sensing means.

6. An apparatus for reducing deposition of residue in a first housing, said residue being formed from a vapor in said first housing, said vapor generated by a semiconductor process reaction chamber during a process, said apparatus comprising:

first pressure sensing means for sensing a pressure in said reaction chamber responding to a first capacitance in said first pressure sensing means, said first pressure sensing means comprising said first housing, said first housing comprising a first diaphragm, said first capacitance being formed by using said first diaphragm and a first platform as a first plurality of electrodes of a first capacitor, said first capacitance being changed owing to a first deflection of said first diaphragm under forces due to said pressure;

pumping means for pumping said vapor from said reaction chamber;

monitoring gas flow control means, said monitoring gas flow control means being opened when said pressure is larger than a first value and smaller than a second value, said first value being smaller than said second value, a first end of said monitoring gas flow control means being connected to said reaction chamber, a second end of said monitoring gas flow control means being connected to said first housing of said first pressure sensing means;

bypass gas flow control means, said bypass gas flow control means being closed when said pressure is larger than a third value and smaller than a fourth value, said third value being smaller than said fourth value, said fourth value being larger than said second value;

a filter connected to said bypass gas flow control means for preventing said residue from passing through said filter;

a flow direction control means for blocking a gas flow from said flow direction control means to said bypass gas flow control means;

a pipe for connecting said first housing of said first pressure sensing means, said bypass gas flow control means, said filter, said flow direction control means and said pumping means;

second pressure sensing means for sensing said pressure in said gas containing means responding to a second capacitance in said second pressure sensing means, said second pressure sensing means comprising a second housing, said second housing comprising a second diaphragm, said second capacitance being formed by using said second diaphragm and a second platform as a second plurality of electrodes of a second capacitor, said second capacitance being changed owing to a second deflection of said second diaphragm under forces due to said pressure, said second housing being connected to said monitoring gas flow control means and said bypass gas flow control means; and reference gas flow control means, said reference gas flow control means being opened when said pressure being larger than a fifth value and smaller than a sixth value, said fifth value is smaller than said sixth value, a first end of said reference gas flow control means being connected to said gas containing means, a second end of said reference gas flow control means being connected to said second housing of said second pressure sensing means.

7. The apparatus as claim 6, wherein said monitoring gas flow control means is a valve.

8. The apparatus as claim 6, wherein said bypass gas flow control means is a valve.

9. The apparatus as claim 7, wherein said flow direction control means comprises a check valve, said check valve being a unidirectional valve.

* * * * *

UNITED STATES PATENT AND TRADEMARK OFFICE
CERTIFICATE OF CORRECTION

PATENT NO. : 5,948,169

DATED : September 7, 1999

INVENTOR(S) : W.-K. Wu

It is certified that error appears in the above-identified patent and that said Letters Patent is hereby corrected as shown below:

| COLUMN | LINE | |
|---|---|---|
| 6 (Claim 2, | 35 line 1) | "as claim 1" should read --of claim 1-- |
| 6 (Claim 3, | 37 line 1) | "as claim 1" should read --of claim 1-- |
| 6 (Claim 4, | 39 line 1) | "as claim 1" should read --of claim 1-- |
| 6 (Claim 5, | 42 line 1) | "as claim 1" should read --of claim 1-- |
| 6 (Claim 5, | 58 line 17) | "pressure being" should read --pressure is-- |
| 8 (Claim 6, | 19 line 56) | "pressure being" should read --pressure is-- |
| 8 (Claim 6, | 21 line 58) | "value is" should read --value being-- |
| 8 (Claim 7, | 28 line 1) | "as claim 6" should read --of claim 6-- |

UNITED STATES PATENT AND TRADEMARK OFFICE
CERTIFICATE OF CORRECTION

PATENT NO. : 5,948,169
DATED : September 7, 1999
INVENTOR(S) : W.-K. Wu

It is certified that error appears in the above-identified patent and that said Letters Patent is hereby corrected as shown below:

COLUMN     LINE

8     30     "as claim 6" should read --of claim 6--
(Claim 8, line 1)

8     32     "as claim 7" should read --of claim 7--
(Claim 9, line 1)

Signed and Sealed this

Fifteenth Day of August, 2000

Attest:

Q. TODD DICKINSON

Attesting Officer     *Director of Patents and Trademarks*